(12) United States Patent
Loibl et al.

(10) Patent No.: US 6,441,609 B2
(45) Date of Patent: Aug. 27, 2002

(54) ELECTRONIC SENSOR ARRAY FOR AN AUTOMATIC GEARBOX COMMUNICATING A MODE SETTING

(75) Inventors: Josef Loibl, Regen; Ulf Scheuerer, Regensburg, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/789,796

(22) Filed: Feb. 20, 2001

Related U.S. Application Data

(63) Continuation of application No. PCT/DE99/02537, filed on Aug. 13, 1999.

(30) Foreign Application Priority Data

Aug. 19, 1998 (DE) .......................... 198 37 640

(51) Int. Cl.⁷ .................. G01B 7/14; G01B 7/30; G01R 33/06
(52) U.S. Cl. .................. 324/207.2; 324/207.24; 324/207.25
(58) Field of Search .............. 324/207.2, 207.21, 324/207.24, 207.11, 207.12, 207.13, 207.14, 207.15, 207.16, 207.17, 207.18, 207.19, 207.22, 207.23, 207.25, 207.26

(56) References Cited

U.S. PATENT DOCUMENTS 4,793,241 A * 12/1988 Mano et al. ................. 92/5 R
5,014,005 A * 5/1991 Murata et al. ............ 324/207.2
5,345,040 A * 9/1994 Stade et al. ................. 174/260
6,007,250 A * 12/1999 Brauer et al. ............... 384/448

FOREIGN PATENT DOCUMENTS

| DE | 38 27 937 A1 | 2/1990 |
| DE | 41 41 958 A1 | 6/1993 |
| DE | 41 42 727 A1 | 7/1993 |
| DE | 44 15 133 C1 | 6/1995 |
| DE | 44 25 904 A1 | 1/1996 |
| DE | 44 44 715 C2 | 6/1996 |
| DE | 195 04 820 C1 | 7/1996 |
| DE | 195 46 865 C1 | 10/1996 |
| DE | 196 03 197 C1 | 2/1997 |
| DE | 295 13 950 U1 | 2/1997 |
| DE | 196 04 489 A1 | 8/1997 |
| DE | 196 12 337 A1 | 10/1997 |
| DE | 196 18 631 A1 | 11/1997 |
| DE | 196 24 494 A1 | 1/1998 |
| DE | 297 14 223 U1 | 1/1998 |
| DE | 197 12 842 C1 | 8/1998 |
| EP | 0 217 365 A2 | 4/1987 |

* cited by examiner

*Primary Examiner*—Edward Lefkowitz
*Assistant Examiner*—Reena Aurora
(74) *Attorney, Agent, or Firm*—Laurence A. Greenberg; Werner H. Stemer; Gregory L. Mayback

(57) ABSTRACT

An electronic sensor array 1 for installation in an automatic gearbox includes a fluid-tight, in particular oil-tight, housing having a baseplate and a housing lid. The housing lid is connected to the baseplate. A conductor track carrier is mounted on the side of the baseplate facing the housing lid. A sensor element is electrically connected to the conductor track carrier. A detector element is disposed outside the housing and interacts with the sensor element.

20 Claims, 1 Drawing Sheet

ELECTRONIC SENSOR ARRAY FOR AN AUTOMATIC GEARBOX COMMUNICATING A MODE SETTING

CROSS-REFERENCE TO RELATED APPLICATION

This application is a continuation of copending International Application No. PCT/DE99/02537, filed Aug. 13, 1999, which designated the United States.

BACKGROUND OF THE INVENTION

Field of the Invention

The invention relates to an electronic sensor array for installation in an automatic gearbox in motor vehicles.

Automatic gearboxes in passenger cars are generally controlled electronically. The control units for automatic gearboxes have hitherto been provided as so-called "stand-alone" units in a control box protected against environmental influences, or have been installed directly in the passenger compartment of the vehicle. Recently, practice has changed to integrating the control electronics and the associated sensor system directly into the automatic gearbox. Where automatic gearboxes are concerned, the sensor system is primarily a position detection sensor that is used to sense which driving mode of the automatic gearbox has been set. This is accomplished, for example, by setting the selector switch to one of the positions "P" (=Parking), "R" (=Reverse), "N" (=Neutral) or "D" (=Drive). The selector switch is mechanically linked to the automatic gearbox by actuating a selector slide that can move linearly or rotationally. The selector slide is integrated into the hydraulic part of the gearbox controller. The selector slide position is conveyed to the electronic control unit by the position of the selector slide being sensed by the position detection sensor.

In terms of position detection, the prior art teaches an independent sensor packaged in an oil-tight fashion in a housing in order to protect against the surrounding medium, namely gearbox oil. The electrical connection of the sensor via appropriate lines to the control unit must also be oil-tight.

Various measuring principles are conceivable for the actual embodiment of the sensors. For example, it is possible to provide magnetic field sensors that are based on the Hall effect. This is known, for example, from DE 196 03 197 C1. Magnetic field sensors based on the GMR effect (also known as, Giant Magneto-Resistive Effect) are possible. Finally, sensors that operate inductively or capacitively can also be used for sensing the position of a metal part on the selector slide.

In addition to the position detection sensors, rpm sensors, pressure sensors and temperature sensors are also important.

German Published, Non-Prosecuted Patent Application DE 41 42 727 A1 discloses an rpm sensor in which the interior of a pot-shaped lid is closed and sealed with a supplementary lid. In this way, a printed circuit board disposed in the interior is protected, with its electronic circuitry and electronic components, such as a Hall element, for example, against dust, fluids, vapors and the like. Electrical leads make the electrical connection of the sensor to the outside. In order to ensure the operational capability of the sensor, this electrical connection must also be effected in a sealed fashion.

Commonly-assigned German Published, Non-Prosecuted Patent Application DE 38 27 937 A1 discloses how the measuring circuit of an electrical measured value sensor is connected to a connecting cable by a flexible line element, for example a flexible printed circuit board. This configuration also requires, on the one hand, the housing of the measured value sensor to be sealed and, on the other hand, the electrical connection with conductors of the connecting cable to be embodied in a sealed fashion.

A disadvantage of the prior art sensor arrays is the high cost of oil-tight installation and connection of the sensors to the control electronics.

SUMMARY OF THE INVENTION

It is accordingly an object of the invention to provide an electronic sensor array that overcomes the hereinafore-mentioned disadvantages of the heretofore-known devices of this general type and that provides a particularly simple and cost-effective way of integrating sensors into an automatic gearbox.

With the foregoing and other objects in view, there is provided, in accordance with the invention, an electronic sensor array for installation in an automatic gearbox. The sensor array includes a housing having a baseplate and a housing lid connected to the baseplate. The housing has a fluid-tight interior and the baseplate has a side facing the housing lid. A flexible conductor track foil mounts on the side of the baseplate facing the housing lid and extends over the interior. A sensor element is disposed in the interior and electrically connects to the flexible conductor track foil. A detector element which may also be referred to as a pick-up element is disposed outside the housing and interacts with the sensor element.

An advantage of the invention of the instant application is that a "stand-alone" housing is eliminated. The conductor track carrier is embodied as a flexible conductor track foil connected to the housing lid in a fluid-tight fashion. As a result, the fluid-tight connection of the conductor track foil to the baseplate is not necessary. The interior of the housing separately need not be sealed with a sealing compound.

In accordance with another feature of the invention, the flexible conductor track foil is bonded onto the baseplate. The baseplate can be composed of plastic or a paramagnetic metal, such as aluminum.

In accordance with another feature of the invention, the sensor element can be a position detection sensor.

In accordance with another feature of the invention, the sensor element is a Hall sensor and the detector element is a magnet.

In accordance with another feature of the invention, the baseplate has an outside and the detector element is disposed on the outside of the baseplate.

In accordance with another feature of the invention, the sensor element is an rpm sensor. A rotatable detect wheel having a circumference can be included. The detector element is disposed on the circumference of the rotatable detector wheel.

In accordance with another feature of the invention, the sensor element is located on a side of the baseplate. The detector element is disposed on the same side of the baseplate as the sensor element.

In accordance with another feature of the invention, the electronic sensor includes a mounting element connected to the baseplate. The mounting element holds the sensor element.

In accordance with another feature of the invention, the electronic sensor includes a magnet disposed between the sensor element and the baseplate. The magnet interacts with the sensor element.

In accordance with another feature of the invention, Hall sensors have proven advantageous as position detection sensors. The electrical connection to the control electronics then preferably employs bonding.

Other features that are considered as characteristic for the invention are set forth in the appended claims.

Although the invention is illustrated and described herein as embodied in an electronic sensor array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
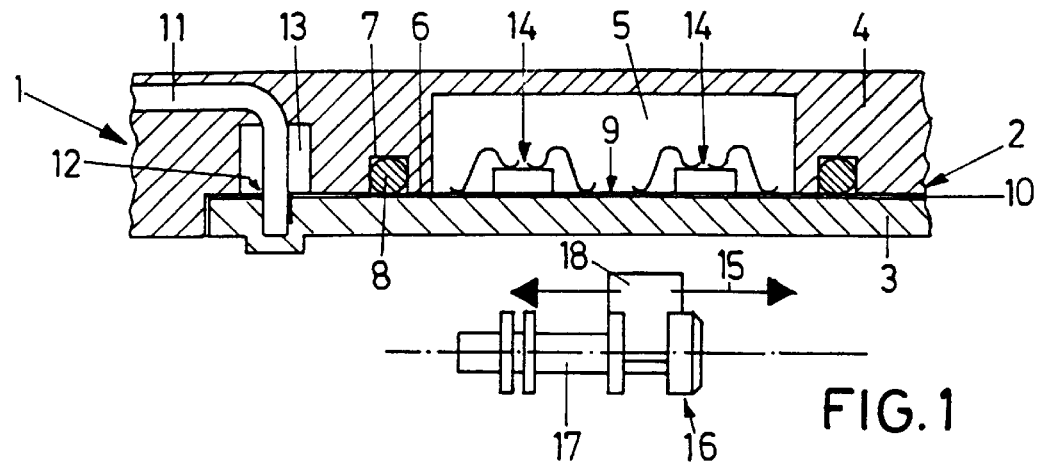
FIG. 1 shows a cross-sectional side view of a sensor array.

In all the figures of the drawing, sub-features and integral parts that correspond to one another bear the same reference symbol in each case.

Figure 2:
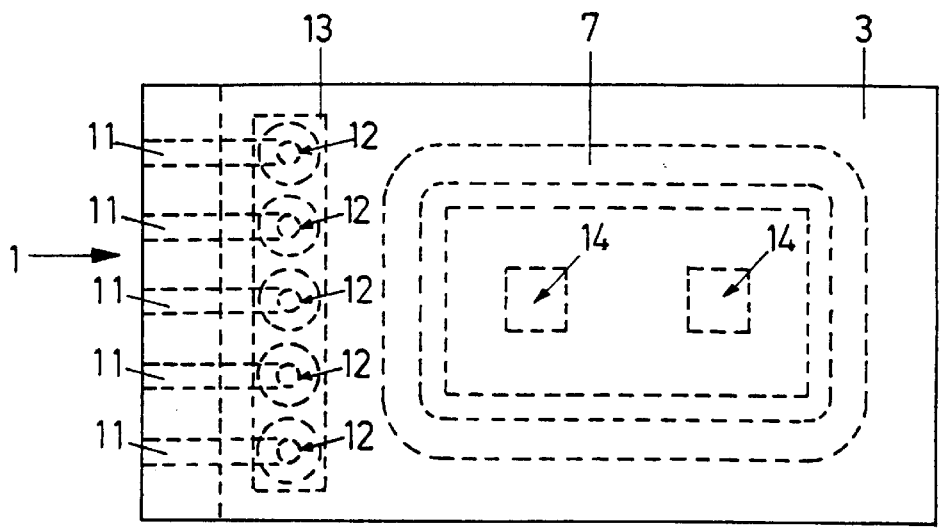
FIG. 2 shows a plan view of the sensor array.

Referring now to the figures of the drawings in detail and first, particularly to FIGS. 1 and 2 thereof, there is shown a first embodiment of an electronic sensor array 1.

The sensor array 1 for an automatic gearbox of a motor vehicle has a housing 2 formed by a baseplate 3 and a housing lid 4. The housing lid 4 has a housing lid interior 5 surrounded by a sealing groove 7 on the underside 6 of the housing lid 4. A sealing element 8, in particular a sealing ring, which seals off the interior 5 from the surroundings of the housing 2 in a fluid-tight fashion, in particular in an oil-tight fashion, is provided in the sealing groove 7. The housing lid 4 is riveted onto the baseplate 3 or connected to the baseplate 3 in some other suitable way. The housing lid 4 can be embodied in an integrated fashion into a composition lid for the electronics of the gearbox. This embodiment is particularly advantageous.

A conductor track carrier 9 is provided on the baseplate 3 and is connected in a planar fashion. The conductor track carrier 9 is a flexible conductor track foil 10 of a known type, which is bonded onto the baseplate 3 and extends over the region of the interior 5. Connector wires 11 make electrical contact with the conductor track foil 10. The conductor wires 11 are also routed through the housing lid 4 from the outside and attached in the baseplate 3 so that they connect in an electrically conductive fashion to the conductor track foil 10. A recess 13 for compensating manufacturing tolerances is provided above the contact region 12 between the connector wires 11 and the baseplate 3. A further possible way of making contact between the flexible conductor track foil 10 and wires, punched grids, or a second flexible conductor track foil 10 is, for example, welding or soldering.

In the interior 5, sensor elements 14 that are used for position detection are provided on the conductor track foil 10 and are electrically connected to the latter. The sensor elements 14 are embodied as Hall sensors. However, coil elements may also be provided for position detection. A detector element 16 that can be displaced in a displacement direction 15 is provided underneath the baseplate 3. The detector element 16 is embodied as a selector slide 17 of the hydraulics of the automatic gearbox. The selector slide 17 is fitted with a magnet 18 on the side facing the baseplate 3. The detector element 16 also can be embodied in some other known way.

During operation, the selector slide 17 that is surrounded by oil is moved into a position that is desired by the user of the automatic gearbox. The position of the selector slide 17 can be determined on the basis of the interaction between the magnet 18 and the sensor elements 14. The position signals, which are determined, are passed onto the gearbox via the connector wires 11.

Figure 3:
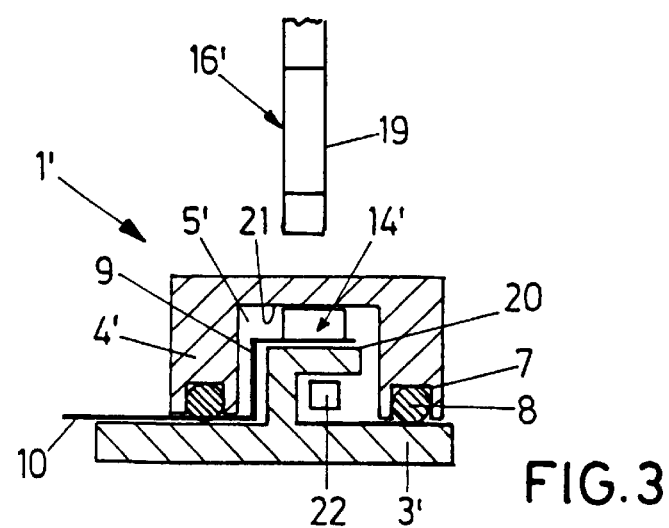
FIG. 3 shows a cross-sectional side view of a sensor array according to a second embodiment.

A second embodiment of the invention is illustrated in FIG. 3. Only the differences will be described below. Identical parts are provided with the same reference symbol. However, different elements, which are functionally equivalent, are provided with the same symbol plus an apostrophe.

The sensor array 1' is used for measuring rotational speeds in an automatic gearbox. The detector element 16' is embodied as a rotating detector wheel 19, in particular as a gear wheel or magnetic pulse wheel, which is disposed above the housing lid 4' in FIG. 3. Provided within the interior 5' is a carrier 20, which is connected to the baseplate 3', and on which the conductor track carrier 9 is mounted. The sensor element 14' is disposed on the carrier 20 in the vicinity of the cover 21 of the interior 5', with the result that the sensor element 14' is sufficiently close to the detector element 16'. Depending on the method of operation of the sensor element 14', a magnet 22 may be provided under it.

We claim:

1. An electronic sensor array for installation in an automatic gearbox, comprising:
    a housing including a baseplate and a housing lid connected to said baseplate, said housing having a fluid-tight interior and said baseplate having a side facing said housing lid;
    a flexible conductor track foil mounted on said side of said baseplate facing said housing lid and extending over said interior;
    a sensor element disposed in said interior and electrically connected to said flexible conductor track foil; and
    a pick-up element disposed outside the housing and communicating a mode setting to said sensor element.

2. The electronic sensor array according to claim 1, wherein said flexible conductor track foil is bonded onto said baseplate.

3. The electronic sensor array according to claim 1, wherein said baseplate is composed of plastic.

4. The electronic sensor array according to claim 1, wherein said baseplate is composed of a paramagnetic metal.

5. The electronic sensor array according to claim 4, wherein said paramagnetic metal is aluminum.

6. The electronic sensor array according to claim 1, wherein said sensor element is a position detection sensor.

7. The electronic sensor array according to claim 6, wherein said sensor element is a Hall sensor and said detector element is a magnet.

8. The electronic sensor array according to claim 6, wherein said sensor element is a Hall sensor.

9. The electronic sensor array according to claim 6, wherein said pick-up element is a magnet.

10. The electronic sensor array according to claim 6, wherein said baseplate has an outside and said pick-up element is disposed on said outside of said baseplate.

11. The electronic sensor array according to claim 1, wherein said sensor element is an rpm sensor.

12. The electronic sensor array according to claim 11, including a rotatable detect wheel having a circumference; and said pick-up element disposed on said circumference of said rotatable pick-up wheel.

13. The electronic sensor array according to claim 11, wherein said baseplate has an outer side facing away from said housing lid, and said pick-up element is disposed in proximity to said outer side of said baseplate.

14. The electronic sensor array according to claim 11, including a carrier element connected to said baseplate for holding said sensor element.

15. The electronic sensor array according to claim 14, including a magnet disposed between said sensor element and said baseplate interacting with said sensor element.

16. The electronic sensor array according to claim 1, wherein said housing is oil-tight.

17. The electronic sensor array according to claim 1, wherein said mode setting is a driving mode setting for an automatic gearbox.

18. The electronic sensor array according to claim 1, wherein said pick-up element is disposed movably and communicates a mode setting by moving relative to said sensor element.

19. In combination with an automatic gearbox, an electronic sensor array, comprising:

a housing including a baseplate and a housing lid connected to said baseplate, said housing having a fluid-tight interior and said baseplate having a side facing said housing lid;

a flexible conductor track foil mounted on said side of said baseplate facing said housing lid and extending over said interior;

a sensor element disposed in said interior and electrically connected to said flexible conductor track foil; and a pick-up element disposed outside the housing communicating a desired mode setting for the automatic gearbox to said sensor element.

20. The electronic sensor array according to claim 19, wherein said pick-up element is disposed movably and communicates a mode setting by moving relative to said sensor element.

* * * * *